(12) United States Patent
Huang et al.

(10) Patent No.: US 10,470,317 B2
(45) Date of Patent: Nov. 5, 2019

(54) METHOD FOR MANUFACTURING CIRCUIT BOARD

(71) Applicant: Unimicron Technology Corp., Taoyuan (TW)

(72) Inventors: Hsiang-Hung Huang, New Taipei (TW); Chi-Min Chang, Taoyuan (TW)

(73) Assignee: UNIMICRON TECHNOLOGY CORP., Taoyuan (TW)

(*) Notice: Subject to any disclaimer, the term of this patent is extended or adjusted under 35 U.S.C. 154(b) by 97 days.

(21) Appl. No.: 15/853,990

(22) Filed: Dec. 26, 2017

(65) Prior Publication Data

US 2019/0141842 A1 May 9, 2019

(30) Foreign Application Priority Data

Nov. 8, 2017 (TW) ............... 106138677 A

(51) Int. Cl.
*H05K 3/46* (2006.01)
*H05K 3/00* (2006.01)
*H05K 3/40* (2006.01)
*H05K 3/06* (2006.01)

(52) U.S. Cl.
CPC .. *H05K 3/4682* (2013.01); *H01L 2221/68381* (2013.01); *H05K 3/0026* (2013.01); *H05K 3/0097* (2013.01); *H05K 3/06* (2013.01); *H05K 3/4038* (2013.01); *H05K 2203/0264* (2013.01); *H05K 2203/0292* (2013.01); *H05K 2203/105* (2013.01); *H05K 2203/107* (2013.01); *Y10S 156/93* (2013.01); *Y10T 156/1121* (2015.01); *Y10T 156/1142* (2015.01)

(58) Field of Classification Search
CPC .................. Y10T 156/1142; Y10T 156/1147
See application file for complete search history.

(56) References Cited

U.S. PATENT DOCUMENTS 5,407,488 A 4/1995 Ray
2006/0252233 A1* 11/2006 Honma ............. H01L 21/67132
438/464

FOREIGN PATENT DOCUMENTS

TW M514922 U 1/2016

* cited by examiner

*Primary Examiner* — Mark A Osele
(74) *Attorney, Agent, or Firm* — CKC & Partners Co., LLC

(57) ABSTRACT

A method for manufacturing a circuit board includes: forming a first adhesive layer on a first surface of a vibration unit, in which the vibration unit includes at least one piezoelectric material layer; forming a first stacking structure on the first adhesive layer; and applying a voltage to the at least one piezoelectric material layer to cause the at least one piezoelectric material layer to vibrate, such that the first stacking structure is separate from the vibration unit.

10 Claims, 15 Drawing Sheets

12a

METHOD FOR MANUFACTURING CIRCUIT BOARD

CROSS-REFERENCE TO RELATED APPLICATION

This application claims priority to Taiwan Application Serial Number 106138677, filed Nov. 8, 2017, which is herein incorporated by reference.

BACKGROUND

Field of Invention

The present disclosure relates to a method for manufacturing a circuit board.

Description of Related Art

With the development of the electronics industry, electronic products have been gradually developed toward multi-functional and high-performance applications. For example, to meet the high integration and miniaturization package requirements of semiconductor packages, most active devices, passive components and/or circuit-connected circuit boards are gradually evolving from single-layer boards to multi-layer boards. Furthermore, under limited space in the electronic products, the available wiring area on the circuit board is expanded by the interlayer connection to meet the demand of the integrated circuit with high electron density.

SUMMARY

The present disclosure provides a method for manufacturing a circuit board. The method includes forming a first adhesive layer on a first surface of a vibration unit in which the vibration unit includes at least one piezoelectric material layer; forming a first stacking structure on the first adhesive layer; and applying a voltage to the at least one piezoelectric material layer of the vibration unit to cause the at least one piezoelectric material layer to vibrate, such that the first stacking structure separate from the vibration unit.

In some embodiments of the present disclosure, the vibration unit and the first adhesive layer define a stacking direction. Applying the voltage to the at least one piezoelectric material layer of the vibration unit further causes the at least one piezoelectric material layer to generate repeated deformations that are substantially parallel to the stacking direction through an alternate current.

In some embodiments of the present disclosure, a surface of the at least one piezoelectric material layer adjacent to the first adhesive layer is the first surface, and the first adhesive layer is in contact with the first surface of the at least one piezoelectric material layer.

In some embodiments of the present disclosure, the vibration unit further includes a substrate. The substrate of the vibration unit is disposed on a side of the at least one piezoelectric material layer away from the first stacking structure.

In some embodiments of the present disclosure, the method further includes: forming a second adhesive layer on a second surface of the vibration unit opposite to the first surface; forming a second stacking structure on the second adhesive layer; and applying the voltage to the at least one piezoelectric material layer, such that the second stacking structure is separated from the vibration unit.

In some embodiments of the present disclosure, the at least one piezoelectric material layer of the vibration unit includes a first piezoelectric material layer and a second piezoelectric material layer. The vibration unit includes a substrate. The substrate of the vibration unit is disposed between the first piezoelectric material layer and the second piezoelectric material layer. A surface of the first piezoelectric material layer of the vibration unit adjacent to the first adhesive layer is the first surface. A surface of the second piezoelectric material layer of the vibration unit adjacent to the second adhesive layer is the second surface.

In some embodiments of the present disclosure, applying the voltage to the at least one piezoelectric material layer further causes the first adhesive layer with the first stacking structure to be separated from the vibration unit. The method further includes: removing the first adhesive layer after applying the voltage to the at least one piezoelectric material layer of the vibration unit.

In some embodiments of the present disclosure, forming the first stacking structure on the first adhesive layer includes: forming a first conductive layer on the first adhesive layer.

In some embodiments of the present disclosure, forming the first stacking structure on the first adhesive layer further includes: forming a first dielectric layer and a second conductive layer on the first conductive layer, such that the first dielectric layer is in contact with the first conductive layer; and patterning the second conductive layer.

In some embodiments of the present disclosure, forming the first stacking structure on the first adhesive layer further includes: forming a second dielectric layer and a third conductive layer on the second conductive layer, such that the second dielectric layer is embedded with the second conductive layer.

In the aforementioned configurations, the voltage P (such as alternating current, AC) is applied to the piezoelectric material layer of the vibration unit to generate repeated deformations on the piezoelectric material layer, thereby enabling the piezoelectric material layer to vibrate. That is, the piezoelectric material layer is vibrated by the inverse piezoelectric effect (i.e., conversion of electrical energy into mechanical energy) thereof, so as to cause the vibration unit to separate from the adhesive layer, thereby enabling the elements to be separated from each other in a non-contact manner. As such, the manufacturing method for the circuit board of the present disclosure can prevent the stacking structure (which may also be referred to as a non-core circuit board) which is formed subsequently from warping due to the contact separating (i.e., manually separating multiple plates from each other), so as to prevent subsequent components from being not positioned and fabricated on the stacking structure in the subsequent process due to the warping phenomenon, thereby improving the yield of the circuit board of the present disclosure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
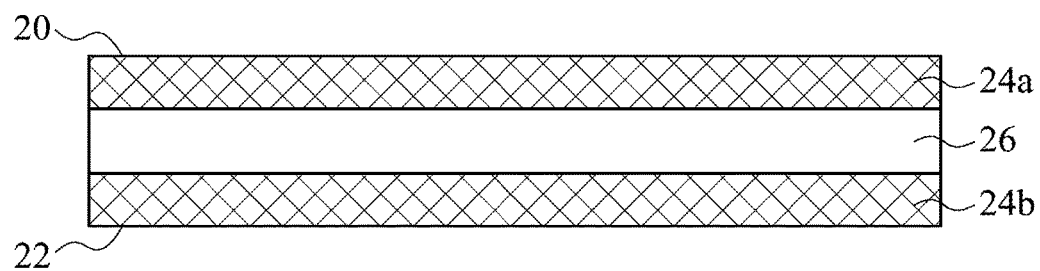
FIGS. 1-14 are cross-sectional views of a circuit board at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIGS. 1-14. FIGS. 1-14 are cross-sectional views of a circuit board 1 (labeled in FIG. 14) at various stages of fabrication in accordance with some embodiments of the present disclosure.

As shown in FIG. 1, a vibration unit 2 is provided. The vibration unit 2 of the present disclosure has a first surface 20 and a second surface 22, and includes a first piezoelectric material layer 24a, a second piezoelectric material layer 24b, and a substrate 26. In the embodiment, a surface of the first piezoelectric material layer 24a of the vibration unit 2 adjacent to a first adhesive layer 10a (shown in FIG. 2) is the first surface 20, and a surface of the second piezoelectric material layer 24b adjacent to the second adhesive layer 10b (shown in FIG. 2) is the second surface 22.

In some embodiments, the substrate 20 is made by prepreg (PP) or another suitable material. A thickness of the substrate 26 is in a range from about 50 μm to about 75 μm, but the present disclosure is not limited thereto. In some embodiments, the first piezoelectric material layer 24a and the second piezoelectric material layer 24b may be made by piezoelectric polymer. For example, the first piezoelectric material layer 24a and the second piezoelectric material layer 24b may be made by polyvinylidene (PVDF), polytetrafluoroethylene (PTFE), or polyvinylchloride (PVC), but the present disclosure is not limited thereto. In some other embodiments, any material that is able to produce piezoelectric effects is applicable to the present disclosure. Thicknesses of the first piezoelectric material layer 24a and the second piezoelectric material layer 24b may be in a range from about 20 μm to about 30 μm respectively, but the present disclosure is not limited thereto. The first piezoelectric material layer 24a and/or the second piezoelectric material layer 24b has the characteristics, such as good chemical erosion resistance, good oxidation resistance, good impact resistance, high piezoelectric conversion efficiency, color changing resistance in high temperature, and other characteristics.

Figure 2:
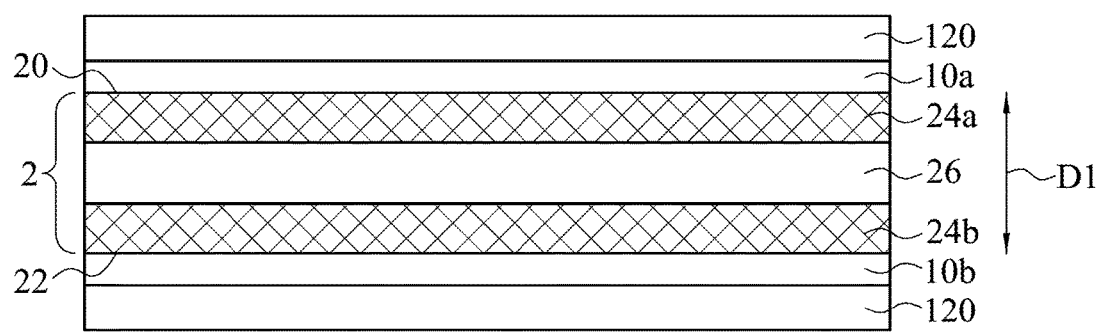

As shown in FIG. 2, the first adhesive layer 10a and the second adhesive layer 10b are formed on the first surface 20 and the second surface 22 of the vibration unit 2 respectively. In the embodiment, the first adhesive layer 10a and the second adhesive layer 10b are in contact with the first surface 20 and the second surface 22 respectively. In the embodiment, the vibration unit 2, the first adhesive layer 10a, and the second adhesive layer 10b define a stacking direction D1.

Then, the first stacking structure 12a and the second stacking structure 12b (shown in FIG. 9) are further formed on the first adhesive layer 10a and the second adhesive layer 10b respectively in a subsequent process. As shown in FIG. 2, the first conductive layers 120 are formed on the first adhesive layer 10a and the second adhesive layer 10b respectively.

In the embodiment, the first adhesive layer 10a and the second adhesive layer 10b may be release films. In some embodiments, the first adhesive layer 10a and the second adhesive layer 10b may be made by, such as polyethylene terephthalate (PET), polyethylene (PE), ortho-phenylphenol (OPP), or another suitable material. Thicknesses of the first adhesive layer 10a and the second adhesive layer 10b may be in a range from about 9 μm to about 18 μm, but the present disclosure is not limited thereto.

Figure 3:
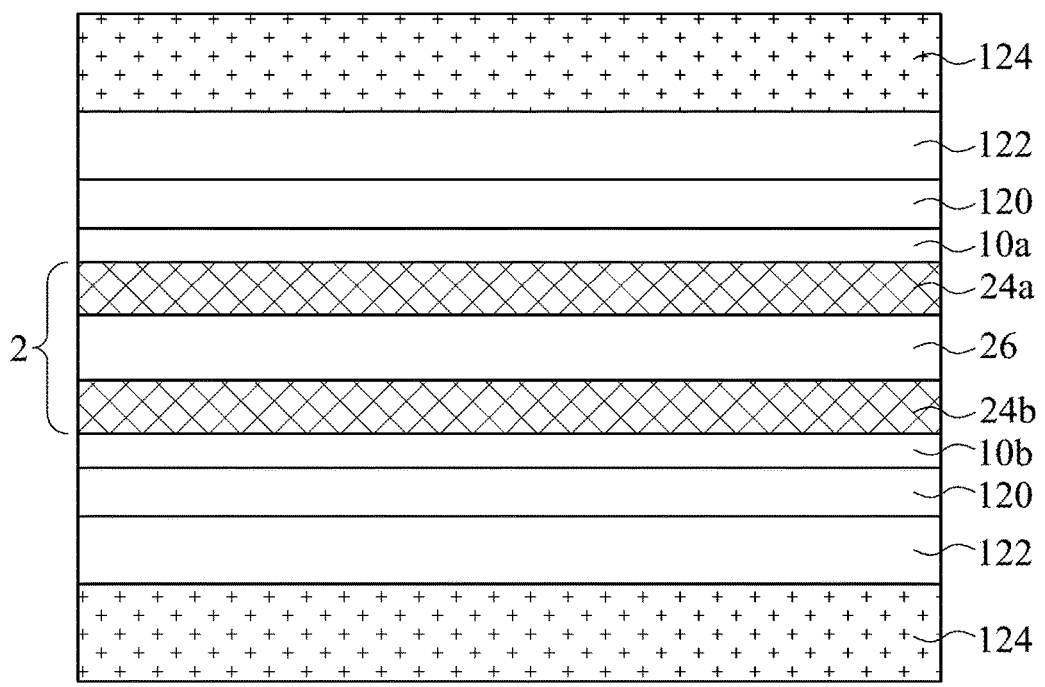

Then, as shown in FIG. 3, a first dielectric layer 122 and a second conductive layer 124 are formed on the first conductive layer 120, such that the first dielectric layer 122 is in contact with and is connected to the first conductive layers 120. Subsequently, the first dielectric layer 122 and the second conductive layer 124 are bonded to the first conductive layers 120 by pressing. In the embodiment, the method for press-bonding the first dielectric layer 122 and the second conductive layer 124 on the first conductive layers 120 includes a vacuum pressing process, but the present disclosure is not limited thereto.

Figure 4:
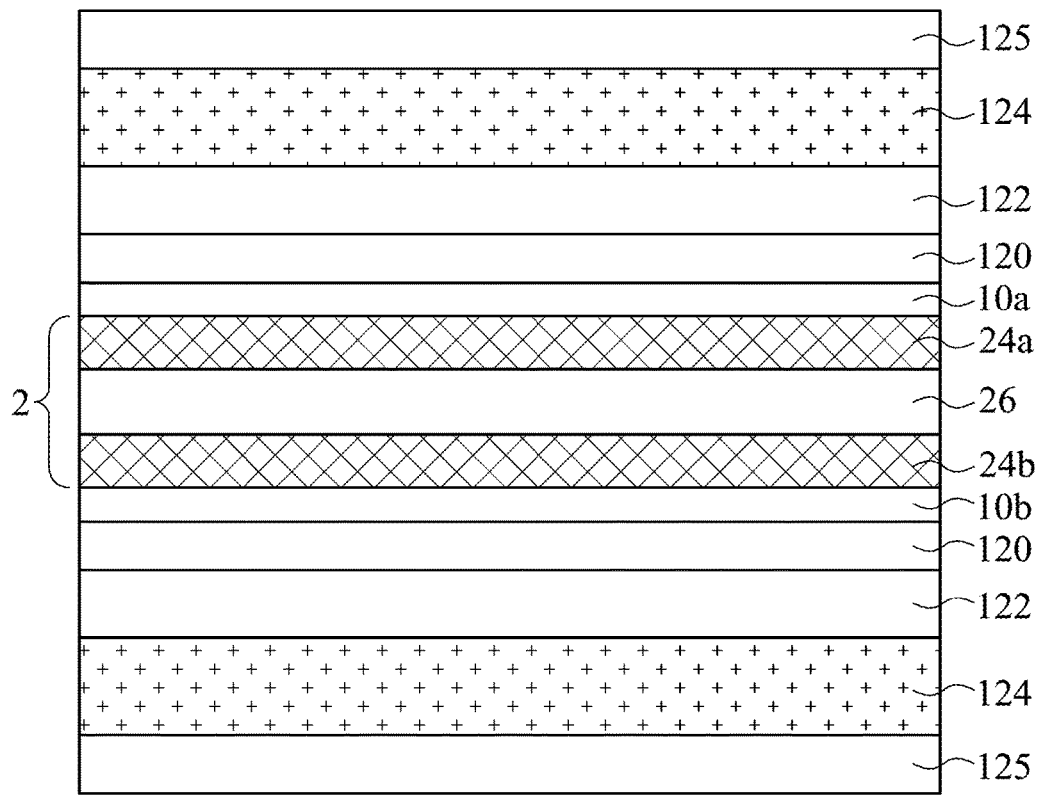

Then, as shown in FIG. 4, after the first dielectric layer 122 and the second conductive layer 124 are formed on the first conductive layers 120, the second conductive layer 124 is to be patterned. Firstly, a mask layer 125 is formed on the second conductive layer 124 by the vacuum pressing machine, but the present disclosure is not limited thereto. In the embodiment, the mask layer 125 is made by a photoimageable dielectric (PID) material.

Figure 5:
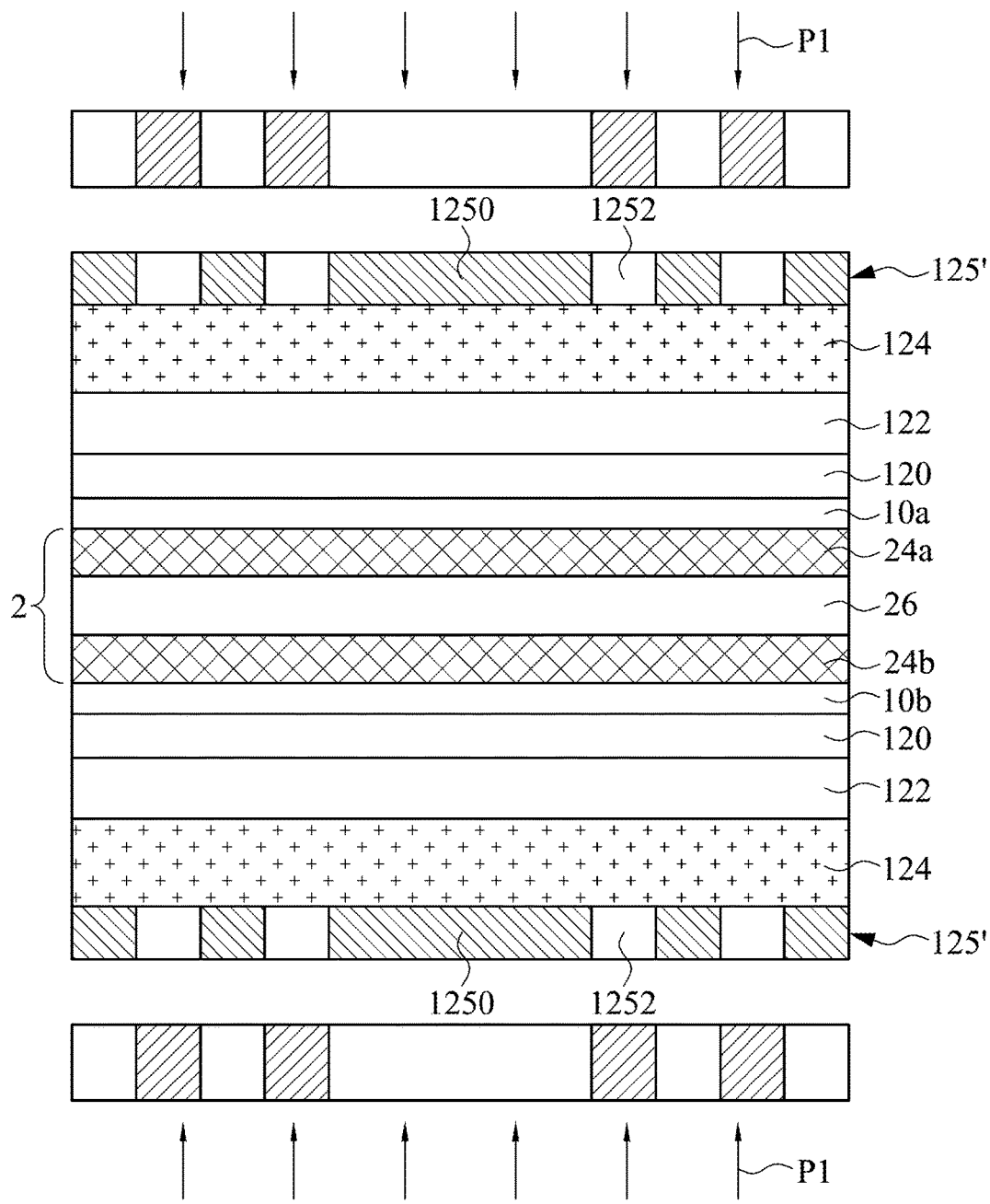

As shown in FIG. 5, after being formed on the second conductive layer 124, the mask layer 125 is to be patterned. Furthermore, an exposure process P1 is performed on the mask layer 125 so as to form an exposure region 1250 and a non-exposure region 1252 on the mask layer 125'.

Figure 6:
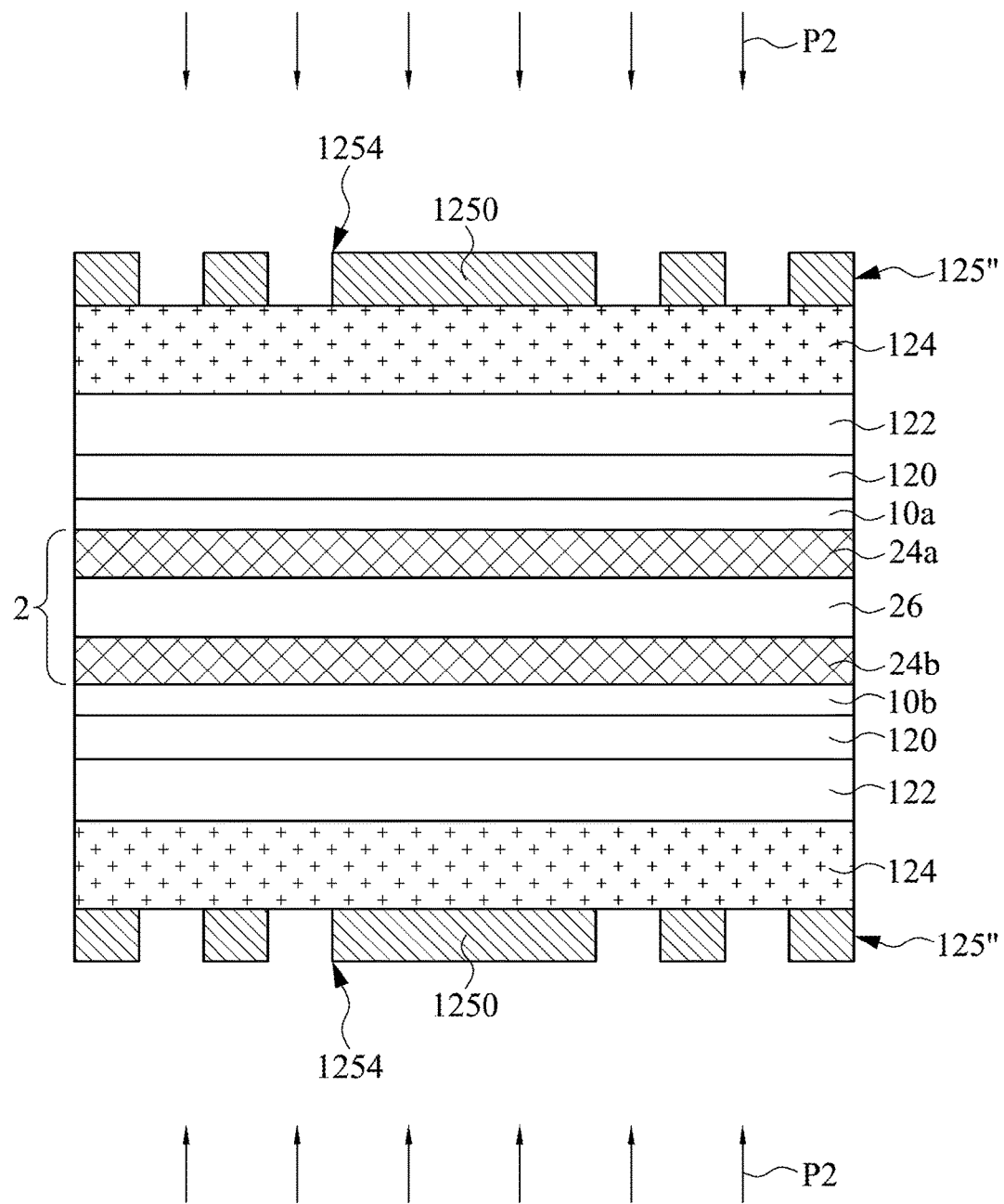

As shown in FIG. 6, after the mask layer 125 is patterned, a development process P2 is performed on the exposed mask layer 125', so as to form a patterned mask layer 125" on the second conductive layer 124. Furthermore, the non-exposure region 1252 (shown in FIG. 5) of the exposed mask layer 125' is removed by the developing process P2, and the exposure region 1250 of the exposed mask layer 125' is remained, such that masking openings 1254 and the patterned mask layer 125" are formed. A portion of the second conductive layer 124 is exposed through the masking openings 1254 of the patterned mask layer 125". Then, after the development process P2 is finished, the patterned mask layer 125″ is cured by a curing process.

Figure 7:
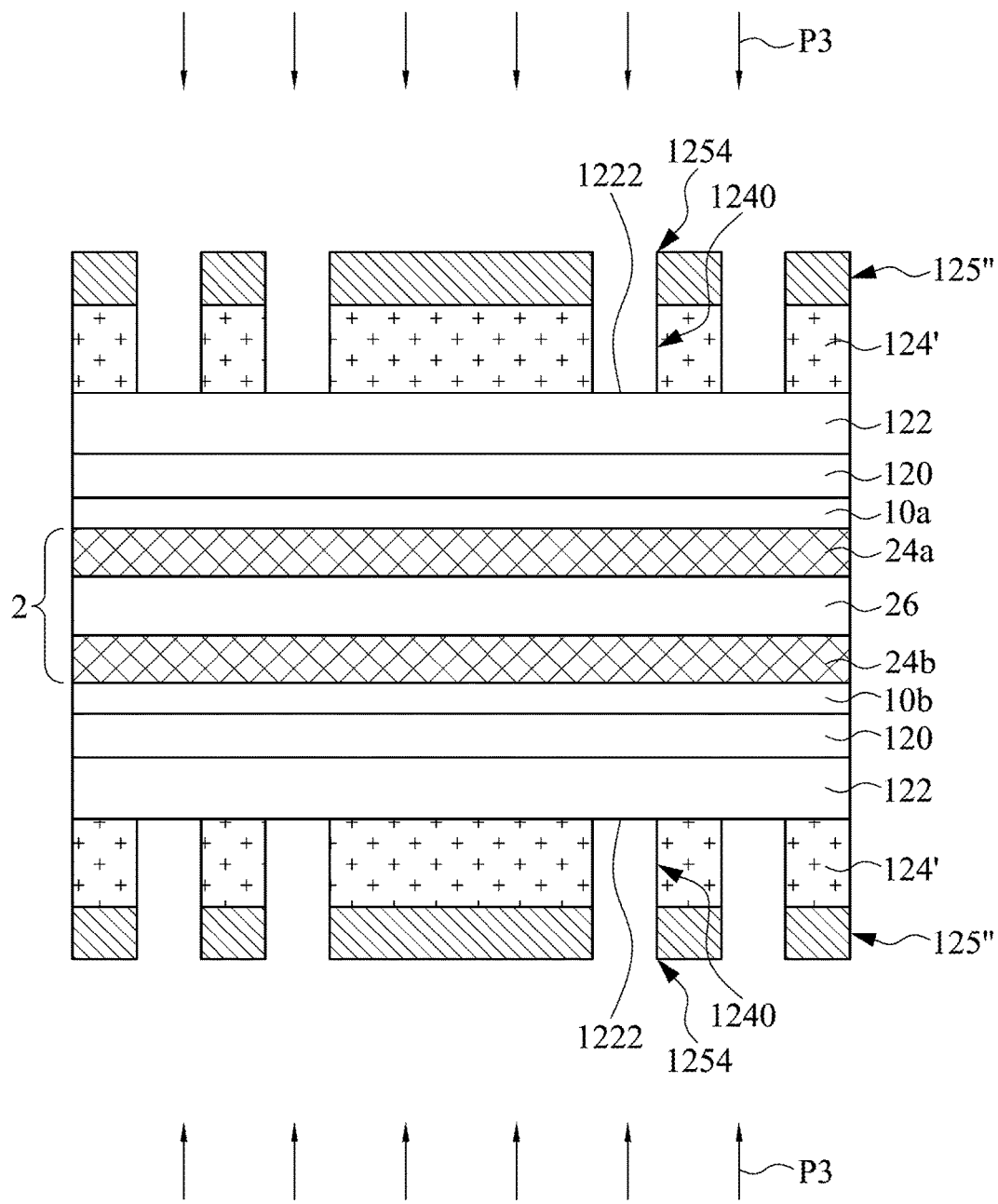

As shown in FIG. 7, after the patterned mask layer 125″ is formed, a removing process is performed on the second conductive layer 124 (shown in FIG. 4) through the masking openings 1254 until a portion of a top surface 1222 of the first dielectric layer 122 is exposed. In the embodiment, the removing process performed on the second conductive layer 124 is an etching process P3. For example, the etching process P3 may include a plasma etching process, an ion beam etching process, a reactive ion etching (RIE) process, or any other suitable process. Furthermore, the etching process P3 is performed on the second conductive layer 124 to form a conductive layer opening 1240 connected to the masking opening 1254 and further to form a patterned second conductive layer 124′. Furthermore, the first dielectric layer 122 of the embodiment may serve as an etch stop to determine an etch end point of the etching process P3.

Figure 8:
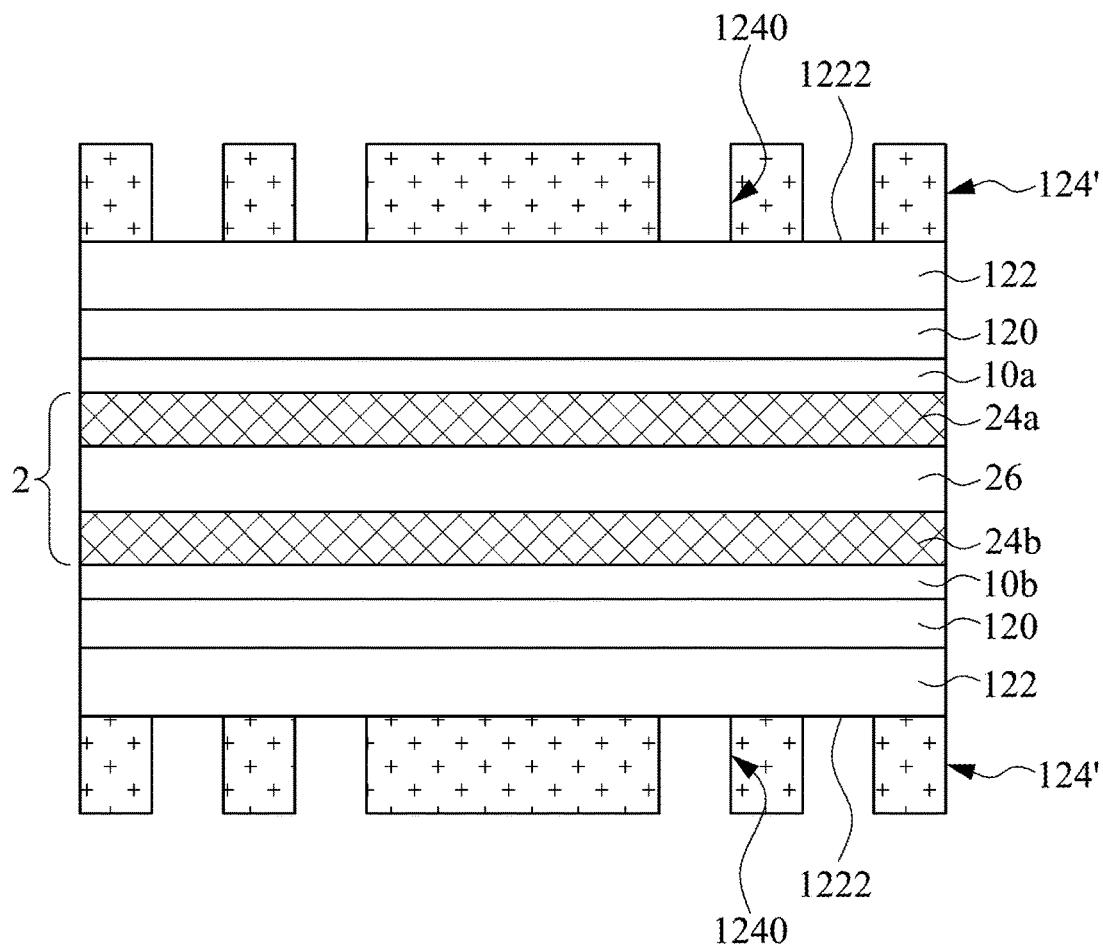

As shown in FIG. 8, after the portion of the top surface 1222 of the first dielectric layer 122 is exposed, the patterned mask layer 125″ is removed, so as to expose the patterned second conductive layer 124′.

Figure 9:
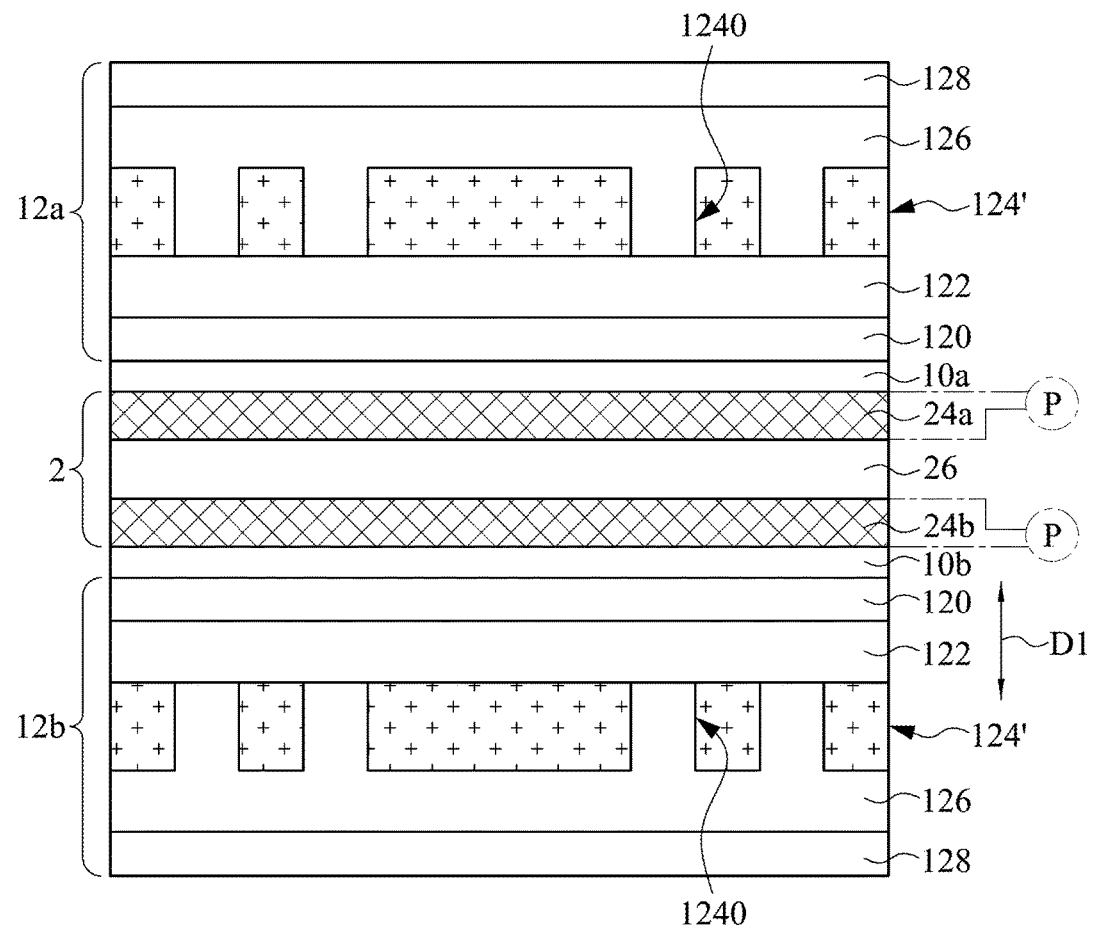

As shown in FIG. 9, a second dielectric layer 126 and a third conductive layer 128 are formed, such that the second dielectric layer 126 is embedded engaged with the patterned second conductive layer 124′, so as to form the first stacking structure 12a and the second stacking structure 12b. In the embodiment, each of the first stacking structure 12a and the second stacking structure 12b includes the first conductive layer 120, the first dielectric layer 122, the patterned second conductive layer 124′, the second dielectric layer 126, and the third conductive layer 128. In the embodiment, the substrate 26 of the vibration unit 2 is disposed on a side of the first piezoelectric material layer 24a away from the first stacking structure 12a, and is disposed between the first piezoelectric material layer 24a and the second piezoelectric material layer 24b. In other words, the substrate 26 of the vibration unit 2 is disposed on a side of the second piezoelectric material layer 24b away from the second stacking structure 12b.

In the embodiment, the second dielectric layer 126 and the third conductive layer 128 are bonded to the patterned second conductive layer 124′ by pressing. Furthermore, portions of the second dielectric layer 126 fill the conductive layer openings 1240 due to the pressing and are in contact with the top surface 1222 of the first dielectric layer 122. In the embodiment, the method for press-bonding the second dielectric layer 126 and the third conductive layer 128 on the patterned second conductive layer 124′ includes a vacuum pressing process, but the present disclosure is not limited thereto.

Figure 10:
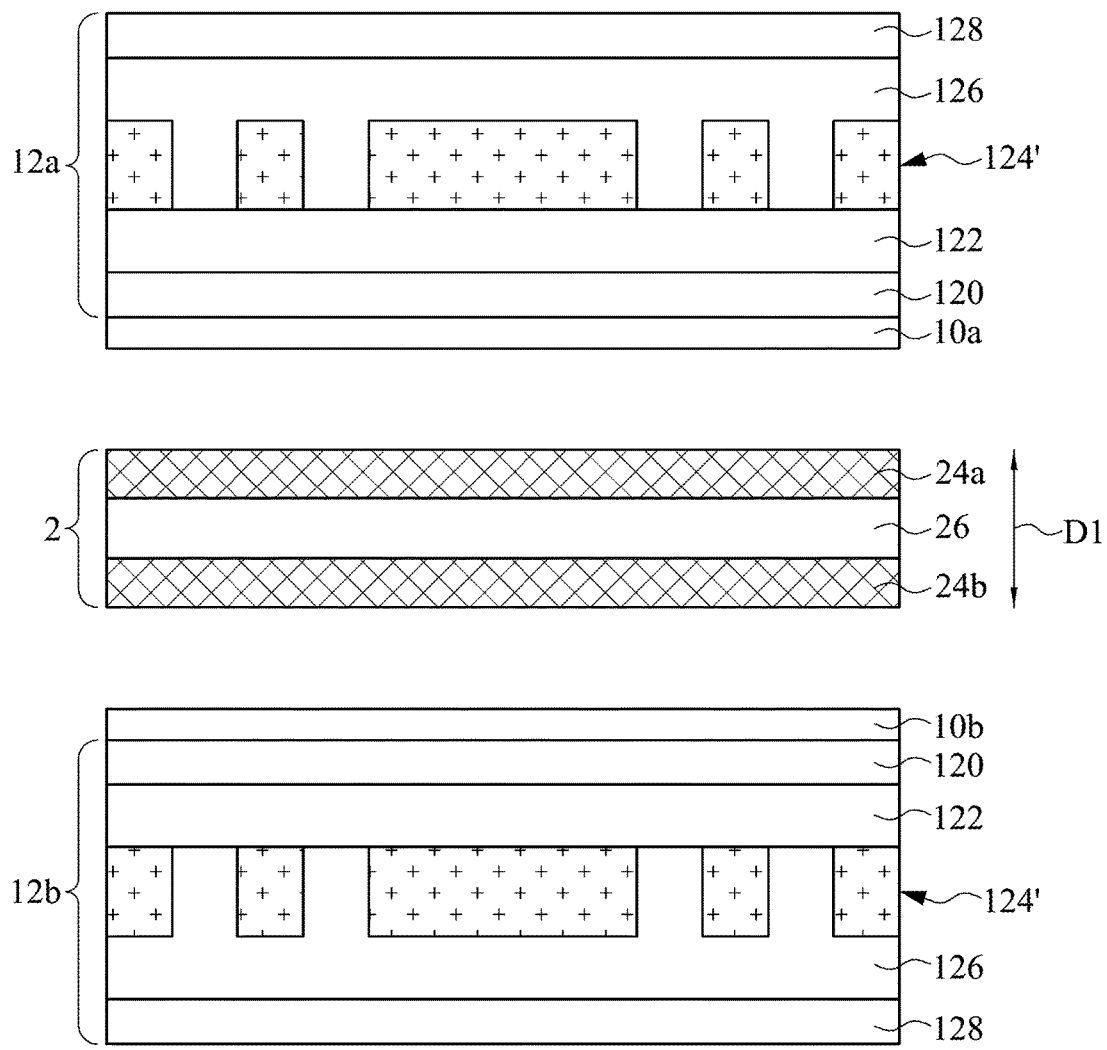

As shown in FIG. 10, a voltage P (such as alternating current, AC) is applied to the first piezoelectric material layer 24a and the second piezoelectric material layer 24b of the vibration unit 2 to generate repeated deformations that are substantially parallel to the stacking direction D1 on the first piezoelectric material layer 24a and the second piezoelectric material layer 24b, thereby enabling the first piezoelectric material layer 24a and the second piezoelectric material layer 24b to vibrate.

That is, when the voltage P is applied to the first piezoelectric material layer 24a and the second piezoelectric material layer 24b, since the electric dipole moment is elongated when the electric field is applied, the first piezoelectric material layer 24a and the second piezoelectric material layer 24b are elongated in the direction of the electric field to resist the change of the electric dipole moment. The process of generating mechanical deformation by the action of the electric field is referred to as an "inverse piezoelectric effect." The inverse piezoelectric effect (i.e., conversion of electrical energy into mechanical energy) causes the first piezoelectric material layer 24a and the second piezoelectric material layer 24b to repeatedly expand and contract to generate a force, in which the force is greater than the peeling strength of the first adhesive layer 10a with respect to the first piezoelectric material layer 24a and second adhesive layer 10b with respect to the second piezoelectric material layer 24b, so as to cause the first piezoelectric material layer 24a of the vibration unit 2 to separate from the first adhesive layer 10a and to cause the second piezoelectric material layer 24b to separate from the second adhesive layer 10b, thereby achieving non-contact plate separation.

Specifically, the voltage P applied to the first piezoelectric material layer 24a of the vibration unit 2 causes the first adhesive layer 10a with the first stacking structure 12a to be separated from the vibration unit 2. Similarly, the voltage P applied to the second piezoelectric material layer 24b of the vibration unit 2 causes the second adhesive layer 10b with the second stacking structure 12b to be separated from the vibration unit 2.

As such, the manufacturing method for the circuit board 1 of the present disclosure can prevent the first stacking structure 12a and the second stacking structure 12b (which may also be referred to as a non-core circuit board) which are formed subsequently from warping caused by contact plate separation (i.e., separating multiple plates manually), and also can prevent subsequent components from failing to be positioned correctly and fabricated on the first stacking structure 12a and the second stacking structure 12b in the subsequent process due to the warping, thus improving the yield of the circuit board 1 of the present disclosure.

In some embodiments, during the process of applying the voltage P to the first piezoelectric material layer 24a and/or to the second piezoelectric material layer 24b in the vibration unit 2, ends of the first stacking structure 12a and the second stacking structure 12b away from the vibration unit 2 are fixed, so as to facilitate separating the first piezoelectric material layer 24a and/or the second piezoelectric material layer 24b from the vibration unit 2. For example, an end of the second stacking structure 12b away from the vibration unit 2 may be fixed to a fixing plate (not shown), and an end of the first stacking structure 12a away from the vibration unit 2 may be fixed to a mechanical arm (not shown).

In some embodiments, the voltage P applied to the first piezoelectric material layer 24a and the second piezoelectric material layer 24b of the vibration unit 2 may generate repeated deformations that are substantially parallel to the stacking direction D1 and are on the first piezoelectric material layer 24a and the second piezoelectric material layer 24b, thereby enabling the first piezoelectric material layer 24a and the second piezoelectric material layer 24b to vibrate, such that the first piezoelectric material layer 24a of the vibration unit 2 is separated from the first adhesive layer 10a, and the second piezoelectric material layer 24b is separated from the second adhesive layer 10b, thereby achieving non-contact plate separation.

Figure 11:
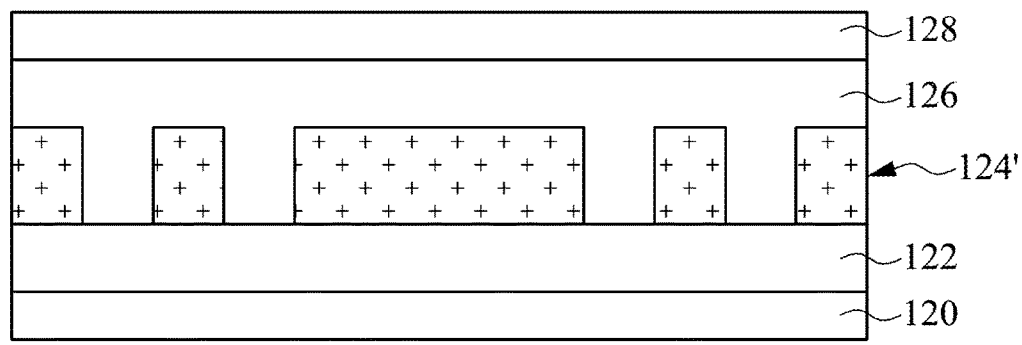

As shown in FIG. 11, after the vibration unit 2 is separated from the first stacking structure 12a and the second stacking structure 12b, the first adhesive layer 10a and the second adhesive layer 10b are removed to form the first stacking structure 12a and the second stacking structure 12b (not shown).

Figure 12:
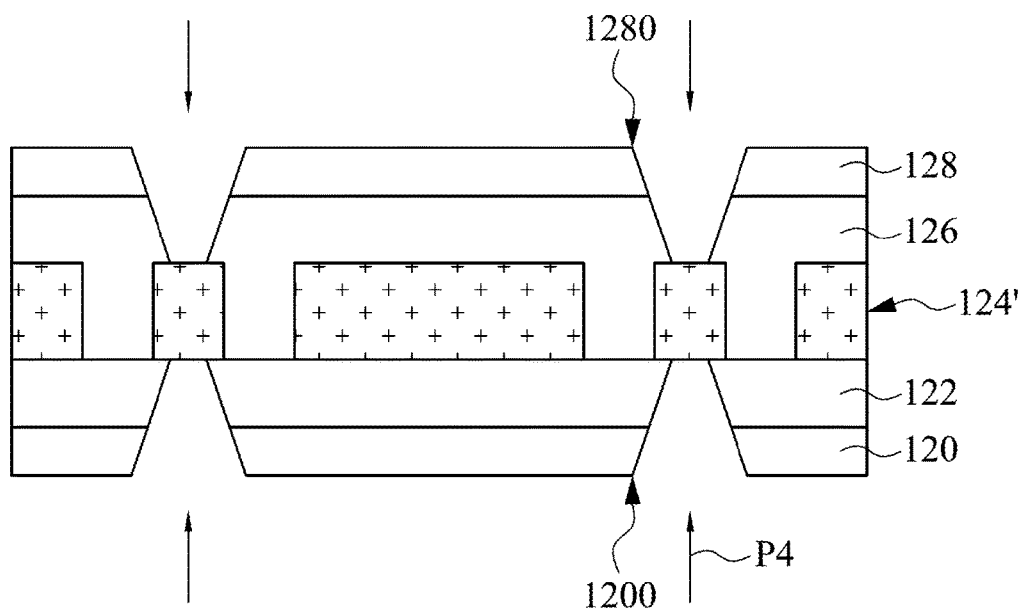

As shown in FIG. 12, after the first adhesive layer 10a and the second adhesive layer 10b are removed, a removing process is performed to remove portions of the first conductive layers 120, the first dielectric layer 122, the second dielectric layer 126, and the third conductive layer 128 until portions of the patterned second conductive layer 124' is exposed. In the embodiment, the method for removing the portions of the first conductive layers 120, the first dielectric layer 122, the second dielectric layer 126, and the third conductive layer 128 includes a laser drilling process P4. Furthermore, the first conductive layers 120 and the first dielectric layer 122 are processed by the laser drilling process P4 to form blind holes 1200 therein, and the second dielectric layer 126 and the third conductive layer 128 are processed by the laser drilling process P4 to form blind holes 1280 therein.

Figure 13:
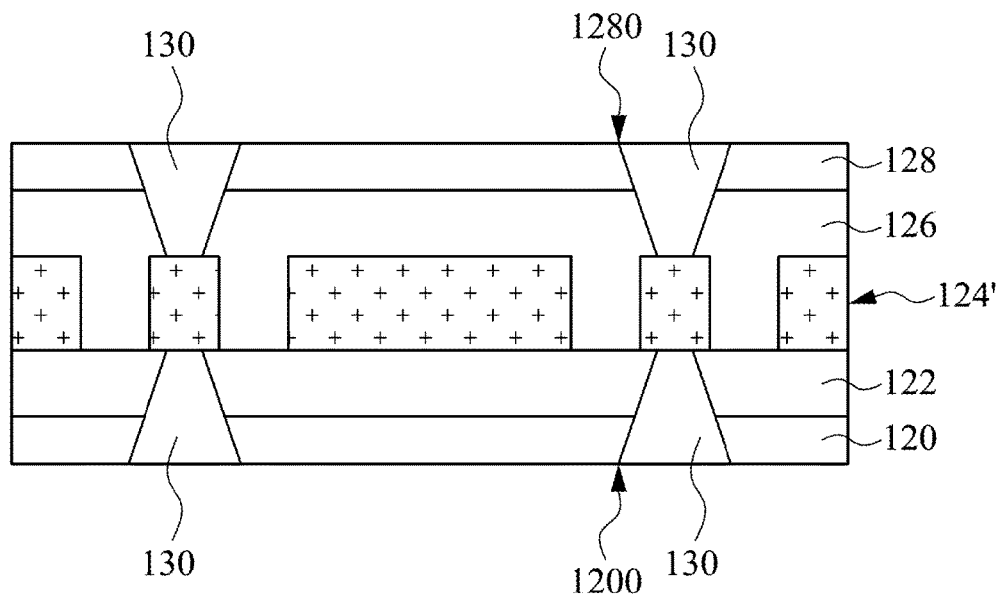

As shown in FIG. 13, after the blind holes 1200 and the blind holes 1280 are formed, the conductive material 130 at least fills the blind holes 1200 and the blind holes 1280.

Figure 14:
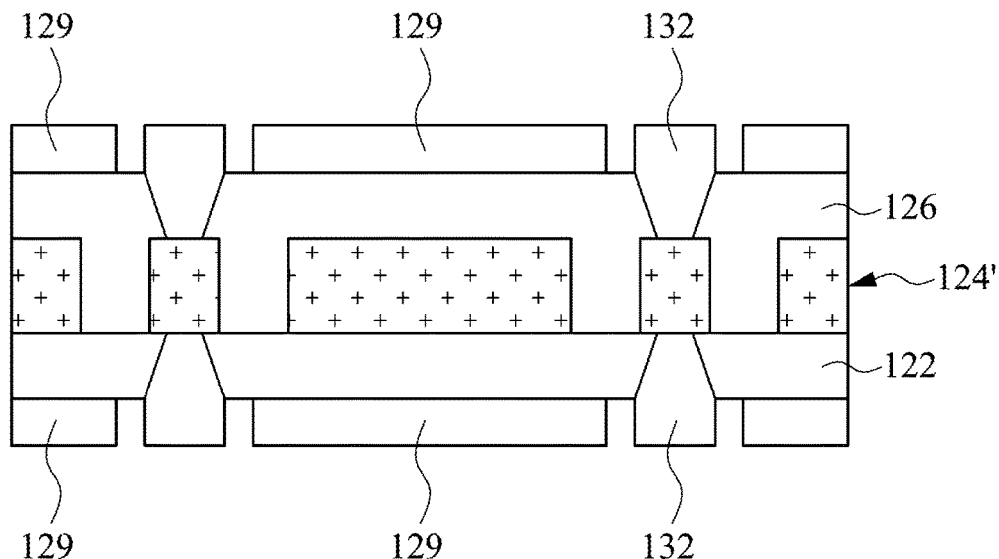

As shown in FIG. 14, after the conductive material 130 is formed, the conductive material 130, the first conductive layer 120, and the third conductive layer 128 are patterned to form conductive lines 129 and interconnections 132, such that the circuit board 1 of the present disclosure is completed. The patterning method of the present embodiment includes a removing process performed on the first conductive layer 120, the third conductive layer 128, and the conductive material 130, such as an etching process.

Figure 15:
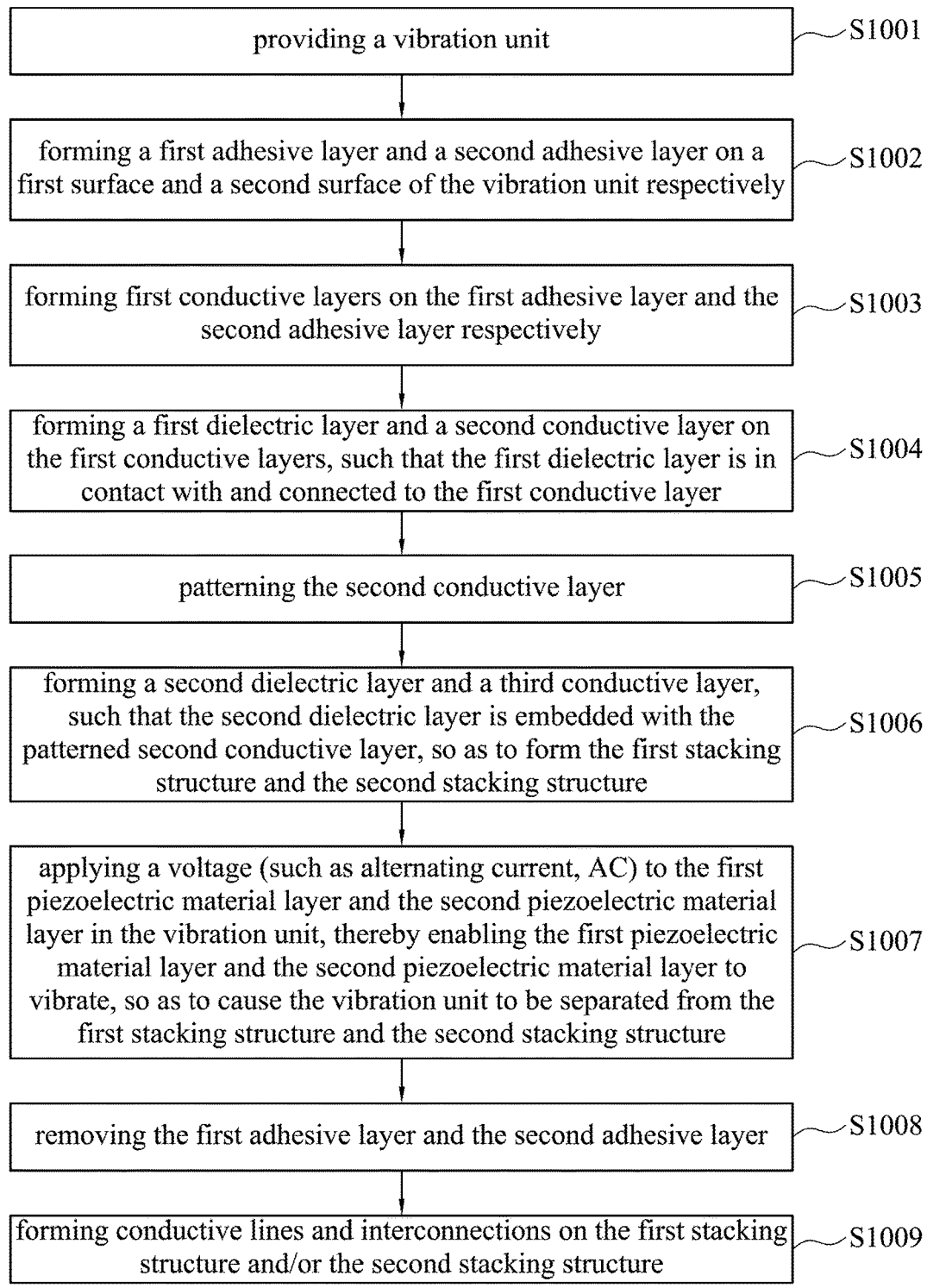
FIG. 15 is a flow chart of a method for manufacturing a circuit board in accordance with some embodiments of the present disclosure.

FIG. 15 is a flow chart of a method 1000 for manufacturing a circuit board 1 in accordance with some embodiments of the present disclosure. It is understood that the method 1000 for manufacturing the circuit board 1 has been simplified for a better understanding of the embodiments of the present disclosure. Accordingly, additional processes may be provided before, during, and after the stages of fabrication of FIGS. 6A-6J, and some other processes may be briefly described herein. Specifically, the method 1000 for manufacturing the circuit board 1 includes steps 1001 to 1009.

The method 1000 proceeds to step S1001, where a vibration unit 2 is provided. FIG. 1 illustrates some embodiments corresponding to step S1001.

The method 1000 proceeds to step S1002, where a first adhesive layer 10a and a second adhesive layer 10b are formed on a first surface 20 and a second surface 22 of the vibration unit 2 respectively. FIG. 2 illustrates some embodiments corresponding to step S1002.

The method 1000 proceeds to step S1003, where first conductive layers 120 are formed on the first adhesive layer 10a and the second adhesive layer 10b respectively.

The method 1000 proceeds to step S1004, where a first dielectric layer 122 and a second conductive layer 124 are formed on the first conductive layers 120, such that the first dielectric layer 122 is in contact with and connected to the first conductive layer 120. FIG. 3 illustrates some embodiments corresponding to step S1004.

The method 1000 proceeds to step S1005, where the second conductive layer 124 is to be patterned. FIGS. 4 to 8 illustrate some embodiments corresponding to step S1005.

The method 1000 proceeds to step S1006, where a second dielectric layer 126 and a third conductive layer 128 are formed, such that the second dielectric layer 126 is embedded with the patterned second conductive layer 124', so as to form the first stacking structure 12a and the second stacking structure 12b. FIG. 9 illustrates some embodiments corresponding to step S1006.

The method 1000 proceeds to step S1007, where a voltage P (such as alternating current, AC) is applied to the first piezoelectric material layer 24a and the second piezoelectric material layer 24b of the vibration unit 2, thereby enabling the first piezoelectric material layer 24a and the second piezoelectric material layer 24b to vibrate, so as to cause the vibration unit 2 to be separated from the first stacking structure 12a and the second stacking structure 12b. FIG. 10 illustrates some embodiments corresponding to step S1007.

The method 1000 proceeds to step S1008, where the first adhesive layer 10a and the second adhesive layer 10b are removed. FIG. 11 illustrates some embodiments corresponding to step S1008.

The method 1000 proceeds to step S1009, where conductive lines 129 and interconnections 132 are formed on the first stacking structure 12a and/or the second stacking structure 12b (not shown), such that the circuit board 1 of the present disclosure is completed. FIGS. 12 to 14 illustrate some embodiments corresponding to step S1009.

Figure 16:
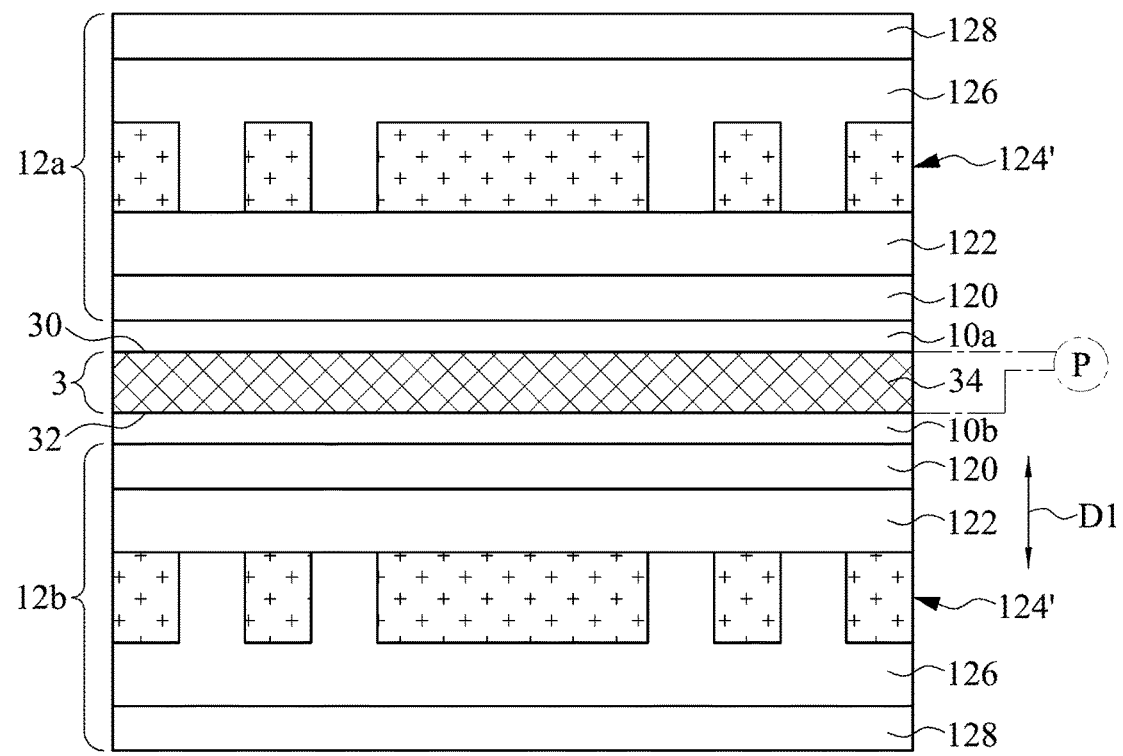
FIGS. 16 and 17 are cross-sectional views of a circuit board at various stages of fabrication in accordance with some other embodiments of the present disclosure.
Figure 17:
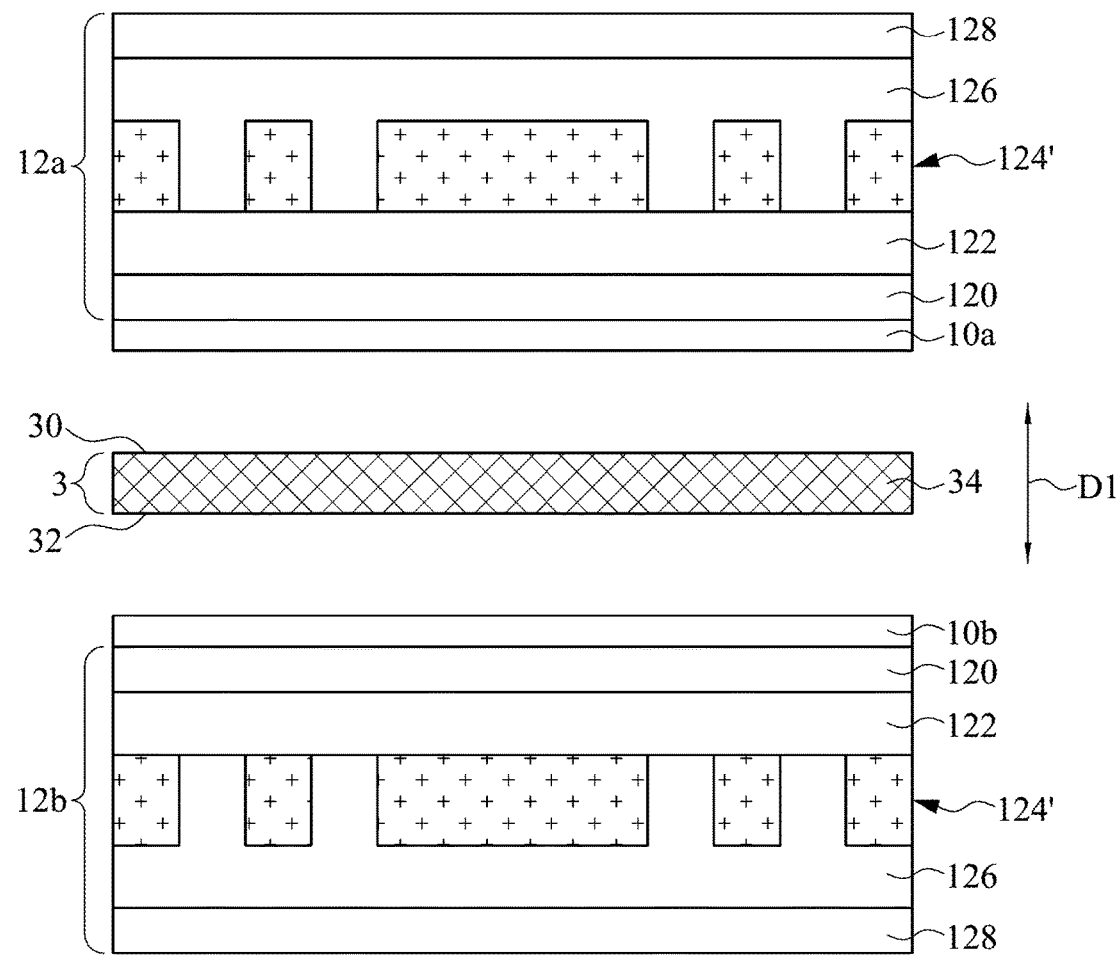

FIGS. 16 and 17 are cross-sectional views of a circuit board 1 at various stages of fabrication in accordance with some other embodiments of the present disclosure. The structure shown in FIG. 16 includes the first stacking structure 12a, the second stacking structure 12b, and the vibration unit 3. The structure and function of the components and their relationships are substantially the same as the structure shown in FIG. 9, and the related detailed descriptions may refer to the foregoing paragraphs, and are not described again herein.

It is noted that, the difference between the present embodiment and the embodiment in FIG. 9 is in that the vibration unit 3 includes only one layer of piezoelectric material layer 34, and does not have the substrate 26 as shown in FIGS. 1 to 10. As shown in FIG. 16, a surface of the piezoelectric material layer 34 in the vibration unit 3 adjacent to the first adhesive layer 10a (see FIG. 16) is the first surface 30, and a surface of the piezoelectric material layer 34 adjacent to the second adhesive layer 10b (see FIG. 16) is the second surface 32. In the embodiment, a thickness of the piezoelectric material layer 34 is greater than about 100 μm, but the present disclosure is not limited thereto. In some other embodiments, the thickness of the piezoelectric material layer 34 can be less than 100 μm. In the embodiment, the first adhesive layer 10a and the second adhesive layer 10b are in contact with the first surface 30 and the second surface 32 respectively. The vibration unit 3, the first adhesive layer 10a, and the second adhesive layer 10b define the stacking direction D1.

As shown in FIG. 17, the voltage P (such as alternating current, AC) is applied to the piezoelectric material layer 34 of the vibration unit 3 to generate repeated deformations that are substantially parallel to the stacking direction D1 and are on the piezoelectric material layer 34, thereby enabling the piezoelectric material layer 34 to vibrate, so as to cause the first stacking structure 12a and the second stacking structure 12b to separate from the vibration unit 3. Specifically, the voltage P applied to the piezoelectric material layer 34 causes the first adhesive layer 10a with the first stacking structure 12a to be separated from the vibration unit 3. Similarly, the voltage P applied to the piezoelectric material layer 34 causes the second adhesive layer 10b with the second stacking structure 12b to be separated from the vibration unit 3.

After the vibration unit 3 is separated from the first stacking structure 12a and the second stacking structure 12b, the first adhesive layer 10a and the second adhesive layer $10b$ are removed respectively, so as to form the first stacking structure $12a$ and the second stacking structure $12b$.

Furthermore, it is noted that, various stages of fabrication for the circuit board 1 after the stage in FIG. 17 of the present disclosure are substantially the same as the steps of fabrication shown in FIGS. 11 to 14, and the related detailed descriptions may refer to the foregoing paragraphs and are not described again herein.

According to the foregoing embodiments of the disclosure, it can be seen that, the voltage P (such as alternating current, AC) is applied to the piezoelectric material layer of the vibration unit to generate repeated deformations on the piezoelectric material layer, thereby enabling the piezoelectric material layer to vibrate. That is, the piezoelectric material layer is vibrated by its inverse piezoelectric effect (i.e., converting electrical energy into mechanical energy), so as to cause the vibration unit to separate from the adhesive layer, thus achieving non-contact plate separation. As such, the manufacturing method of the circuit board of the present disclosure can prevent the stacking structure (which may also be referred to as a non-core circuit board) which is formed subsequently from warping caused by the contact separation (i.e., separating multiple plates from each other manually), so as to prevent subsequent components from being not positioned correctly and fabricated on the stacking structure in the subsequent process due to the warping, thus improving the yield of the circuit board of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a circuit board, the method comprising:
   forming a first adhesive layer on a first surface of a vibration unit, wherein the vibration unit comprises at least one piezoelectric material layer;
   forming a first stacking structure on the first adhesive layer; and
   applying a voltage to the at least one piezoelectric material layer to cause the at least one piezoelectric material layer to vibrate, such that the first stacking structure is separated from the vibration unit.

2. The method of claim 1, wherein the vibration unit and the first adhesive layer define a stacking direction, and applying the voltage to the at least one piezoelectric material layer further causes the at least one piezoelectric material layer to generate repeated deformations that are substantially parallel to the stacking direction by using an alternate current.

3. The method of claim 1, wherein a surface of the at least one piezoelectric material layer adjacent to the first adhesive layer is the first surface of the vibration unit, and the first adhesive layer is in contact with the first surface.

4. The method of claim 1, wherein the vibration unit further comprises a substrate, and the substrate is disposed on a side of the at least one piezoelectric material layer away from the first stacking structure.

5. The method of claim 1, further comprising:
   forming a second adhesive layer on a second surface of the vibration unit opposite to the first surface;
   forming a second stacking structure on the second adhesive layer; and
   applying the voltage to the at least one piezoelectric material layer, such that the second stacking structure is separated from the vibration unit.

6. The method of claim 5, wherein the at least one piezoelectric material layer comprises a first piezoelectric material layer and a second piezoelectric material layer, the vibration unit comprises a substrate, the substrate is disposed between the first piezoelectric material layer and the second piezoelectric material layer, a surface of the first piezoelectric material layer adjacent to the first adhesive layer is the first surface of the vibration unit, and a surface of the second piezoelectric material layer adjacent to the second adhesive layer is the second surface.

7. The method of claim 1, wherein applying the voltage to the at least one piezoelectric material layer further causes the first adhesive layer with the first stacking structure to be separated from the vibration unit, and the method further comprises:
   removing the first adhesive layer from the stacking structure after the first stacking structure is separated from the vibration unit.

8. The method of claim 1, wherein forming the first stacking structure on the first adhesive layer comprises:
   forming a first conductive layer on the first adhesive layer.

9. The method of claim 8, wherein forming the first stacking structure on the first adhesive layer further comprises:
   forming a first dielectric layer and a second conductive layer on the first conductive layer, such that the first dielectric layer is in contact with the first conductive layer; and
   patterning the second conductive layer.

10. The method of claim 9, wherein forming the first stacking structure on the first adhesive layer further comprises:
    forming a second dielectric layer and a third conductive layer on the second conductive layer, such that the second dielectric layer is embedded with the second conductive layer.

* * * * *